United States Patent
Jeng et al.

(10) Patent No.: US 7,449,785 B2
(45) Date of Patent: Nov. 11, 2008

(54) SOLDER BUMP ON A SEMICONDUCTOR SUBSTRATE

(75) Inventors: Shin-Puu Jeng, Hsinchu (TW); Hao-Yi Tsai, Hsinchu (TW); Shang-Yun Hou, Hsinchu (TW); Hsien-Wei Chen, Tainan (TW); Chia-Lun Tsai, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/347,378

(22) Filed: Feb. 6, 2006

(65) Prior Publication Data

US 2007/0182007 A1    Aug. 9, 2007

(51) Int. Cl.
H01L 23/48 (2006.01)
H01L 23/52 (2006.01)
H01L 29/40 (2006.01)

(52) U.S. Cl. ............... 257/779; 257/738; 257/780; 257/781; 257/E23.02; 257/E23.021

(58) Field of Classification Search ............ 257/738, 257/750, 780, 737, 779, 781
See application file for complete search history.

(56) References Cited

U.S. PATENT DOCUMENTS

| | | | |
|---|---|---|---|
| 6,468,898 B1 * | 10/2002 | Usami | 438/638 |
| 6,617,674 B2 | 9/2003 | Becker et al. | |
| 7,015,133 B2 * | 3/2006 | Su et al. | 438/618 |
| 7,033,929 B1 * | 4/2006 | Burke et al. | 438/638 |
| 7,119,439 B2 * | 10/2006 | Watanabe et al. | 257/751 |
| 7,224,063 B2 * | 5/2007 | Agarwala et al. | 257/758 |
| 7,241,676 B2 * | 7/2007 | Watanabe et al. | 438/597 |
| 7,247,555 B2 * | 7/2007 | Cong et al. | 438/622 |
| 7,326,645 B2 * | 2/2008 | Shim | 438/634 |
| 2002/0043723 A1 * | 4/2002 | Shimizu et al. | 257/758 |
| 2004/0182915 A1 | 9/2004 | Bachman et al. | |
| 2005/0082685 A1 * | 4/2005 | Bojkov et al. | 257/780 |

* cited by examiner

Primary Examiner—David A Zarneke
(74) Attorney, Agent, or Firm—Muncy, Geissler, Olds & Lowe, PLLC (57) ABSTRACT

A solder bump on a semiconductor substrate is provided. The solder bump comprises a semiconductor substrate having a top copper pad thereon, a protective layer on the semiconductor substrate and at least one inorganic passivation layer overlying the protective layer with a first opening exposing the top copper pad, wherein the inorganic passivation layer has a thinner portion adjacent a top portion of the first opening. The solder bump further comprises a soft passivation layer on the inorganic passivation layer with a second opening larger than the first opening, an under bump metal layer conformally formed along the first opening and the second opening and a solder bump formed on the under bump metal layer.

10 Claims, 12 Drawing Sheets

SOLDER BUMP ON A SEMICONDUCTOR SUBSTRATE

BACKGROUND OF THE INVENTION

1. Field of the Invention

The present invention relates to semiconductor fabrication, in particular, to solder bumps on a semiconductor substrate and fabrication methods thereof.

2. Brief Discussion of Related Art

The reduction of the feature sizes of semiconductor devices using advanced semiconductor techniques, such as high-resolution lithography and directional etching, have dramatically increased the device packing density on integrated circuit chips formed on a substrate. However, as device packing density increases, the number of electrical metal interconnect layers on the chip must be increased to effectively wire up the discrete devices on the substrate while reducing the chip size. Typically after completing the multilevel interconnect structure, aluminum bonding pads are formed on the top surface of the interconnect structure to provide external electrical connections to the chip. A passivation layer is then applied to passivate the chip from moisture and contamination.

US patent publication no. 20040182915 to Bachman et al. discloses a method comprising forming a copper bond pad for attaching the integrated circuit to a package. Copper oxide is removed from the pad by reduction in a hydrogen ion atmosphere. Alternatively, the structure further comprises an aluminum pad disposed overlying the reduced copper pad.

U.S. Pat. No. 6,617,674 to Becker et al. discloses a semiconductor package comprising a wafer having an active surface comprising at least one integrated circuit, wherein each integrated circuit has a plurality of bond pads; a cured silicone layer covering the surface of the wafer, provided that at least a portion of each bond pad is not covered with the silicone layer and wherein the silicone layer is prepared by the method of the invention. There are, however, still some problems regarding bond pad oxidation and stress.

Therefore, there is still a need to provide a solder bump on a semiconductor substrate and fabrication method thereof to further prevent the copper bond pad from oxidation during a thermal ambient.

Furthermore, there is still a need to provide a solder bump on a semiconductor substrate and fabrication method thereof to reduce the stresses created by the package of the integrated circuit chip.

SUMMARY OF THE INVENTION

It is therefore an object of the invention to provide a solder bump on a semiconductor substrate and fabrication method thereof. The invention can further prevent the copper bond pad from oxidation in a thermal ambient.

Another object of the invention is to reduce the stresses created by the package of the integrated circuit chip.

An embodiment of a method of forming a solder bump on a semiconductor substrate is provided. A semiconductor substrate having a top copper pad thereon is provided. A protective layer is formed on the semiconductor substrate and the top copper pad. At least one inorganic passivation layer is formed overlying the protective layer. The inorganic passivation layer is selectively etched to form a first opening above the top copper pad until the protective layer is exposed. A soft passivation layer is globally formed on the inorganic passivation layer, wherein the soft passivation layer fills the first opening. The soft passivation layer is selectively removed to form a second opening exposing the protective layer. An under bump metal layer is conformally formed along the first opening and the second opening followed by forming a solder bump on the under bump metal layer.

An embodiment of the solder bump on a semiconductor substrate comprises a semiconductor substrate having a top copper pad thereon, a protective layer on the semiconductor substrate and at least one inorganic passivation layer overlying the protective layer with a first opening exposing the top copper pad, wherein the inorganic passivation layer has a thinner portion adjacent a top portion of the first opening. The solder bump further comprises a soft passivation layer on the inorganic passivation layer with a second opening larger than the first opening, an under bump metal layer conformally formed along the first opening and the second opening and a solder bump formed on the under bump metal layer.

Another embodiment of the invention, the second opening is smaller than the first opening so that the soft passivation layer covers the sidewalls of the first opening.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus are not limitative of the present invention, and wherein:

FIG. 1a to FIG. 8b are cross-sections of an embodiment of a method of forming a solder bump on a semiconductor substrate.

DETAILED DESCRIPTION OF THE PREFERRED EMBODIMENTS

Figure 1A:
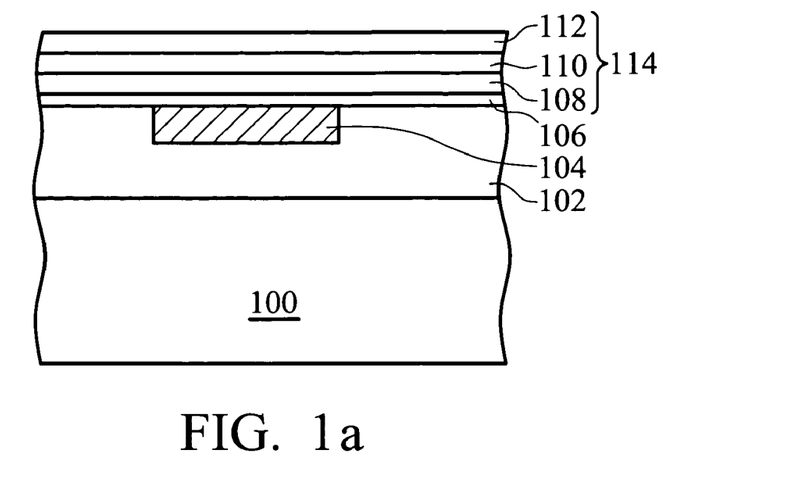

FIG. 1a shows a semiconductor substrate 100 having integrated circuits. At least one dielectric layer 102 and top copper pad 104 are formed on the semiconductor substrate 100. The dielectric layer 102 comprises a low-k material with a dielectric constant less than 3.2, for example an organic polymer based dielectric or an inorganic material such as a carbon-doped oxide or fluorinated silicate glass. Wiring interconnects (not shown) comprising copper are formed within the dielectric layer 102. Top copper pad 104 is disposed, e.g., by damascene technology, within the dielectric layer 102 and serves as a bond pad to connect internal integrated circuits formed on the semiconductor substrate 100 and external circuits. The top copper pad 104 is substantially coplanar with the dielectric layer 102. A protective layer 106 is formed on the dielectric layer 102 and the top copper pad 104. For example, a silicon nitride layer having a thickness of about 300 to about 1000 Å, preferably 750 Å, is deposited on the semiconductor substrate 100 by low pressure chemical vapor deposition using dichlorosilane (SiH$_2$Cl$_2$) and ammonia (NH$_3$). Alternately, silicon nitride can be replaced by silicon oxynitride or silicon carbide.

In some embodiments of the invention, an inorganic passivation layer 114 consisting of a first silicon oxide layer 108, a silicon nitride layer 110 and a second silicon oxide layer 112 is formed overlying the protective layer 106. The first silicon oxide layer 108 having a thickness of about 1000 Å to 3000 Å, the silicon nitride layer 110 having a thickness of about 2000 Å to 5000 Å, and the second silicon oxide layer 112 having a thickness of about 1000 Å to 3000 Å are sequentially deposited on the protective layer 106.

Figure 1B:
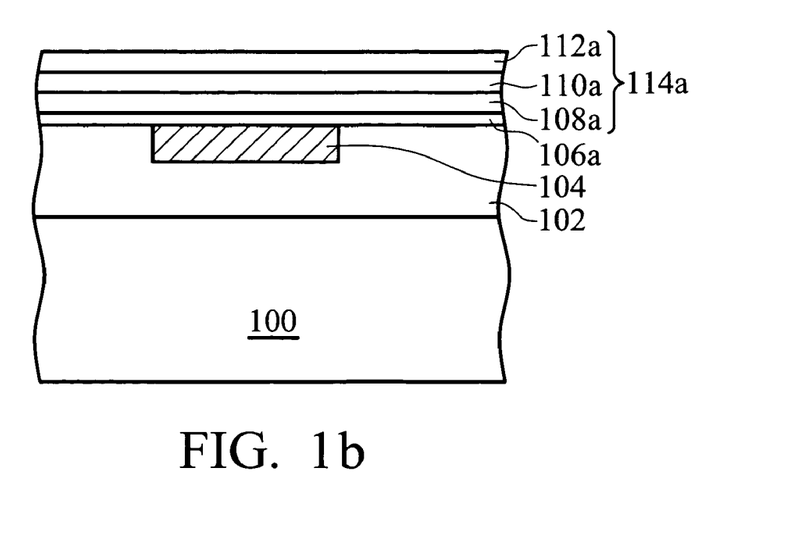

Alternately, as shown in FIG. 1*b*, the inorganic passivation layer 114*a* can comprise the first silicon nitride layer 108*a* directly on the protective layer 106*a*, a second silicon nitride layer 112*a*, and a silicon oxide layer 110*a* sandwiched between the first and the second silicon nitride layers 108*a* and 112*a* while using silicon oxide layer as the protective layer 106*a*.

Figure 2:
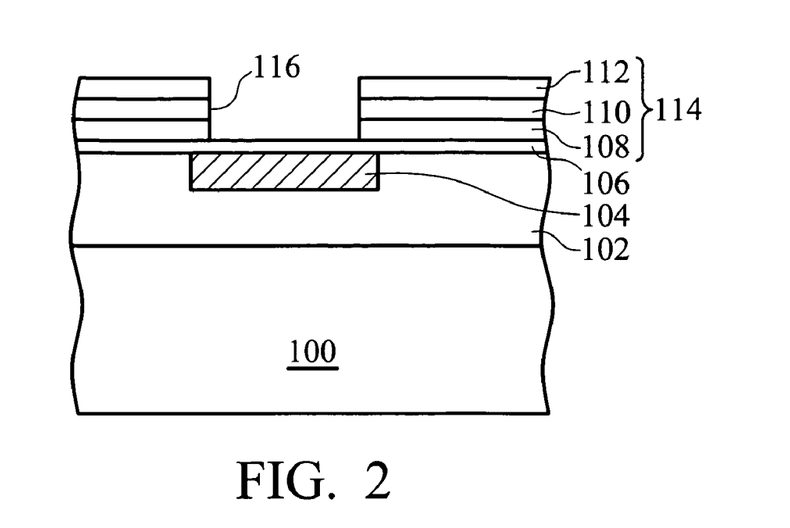

As shown in FIG. 1*a* and FIG. 2, a photoresist pattern (not shown) is formed on the inorganic passivation layer 114 by photolithography. The inorganic passivation layer 114 is then selectively etched to form a first opening 116 above the top copper pad 104 until the protective layer 106 is exposed while using the photoresist pattern as the etching mask. The inorganic passivation layer 114 is etched by ion reactive etching (RIE) introducing CF$_4$ and O$_2$ or CHF$_3$ and O$_2$. Alternately, RIE can be replaced with wet etching. In this step, aluminum via and fuse trench (not shown) are simultaneously formed.

Figure 3:
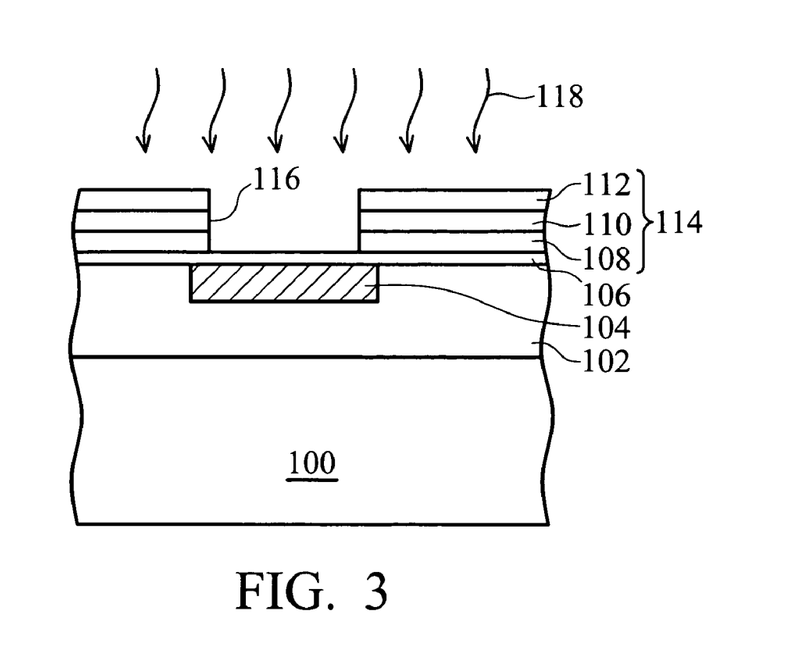

Optionally, as shown in FIG. 3, semiconductor substrate 100 is placed in a chamber with H$_2$ 118 introduced therein and annealed at about 390 to 410° C., preferably about 400° C. for about 30 minutes. The charge damage caused by the aforementioned reactive ion etching can be repaired by annealing.

Figure 4:
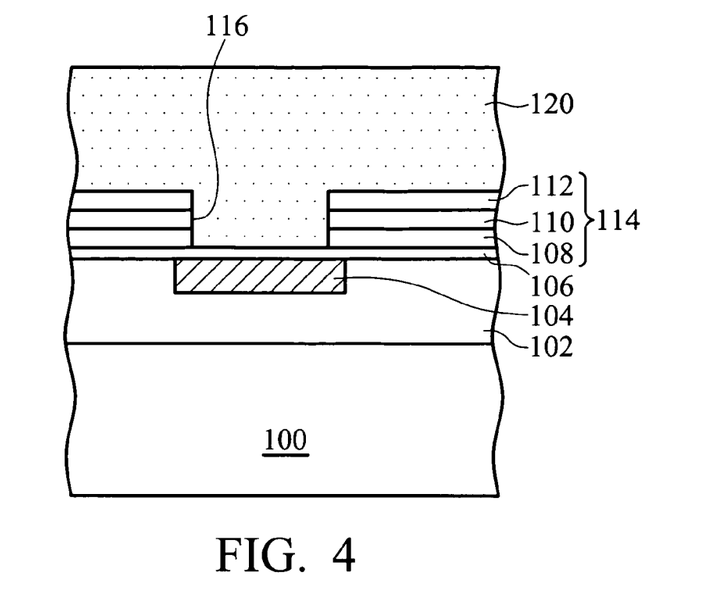
Figure 5A:
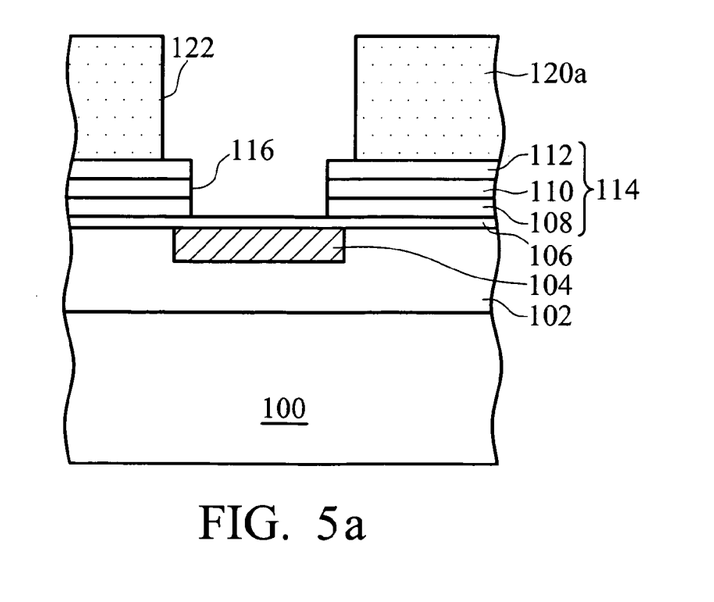
Figure 5B:
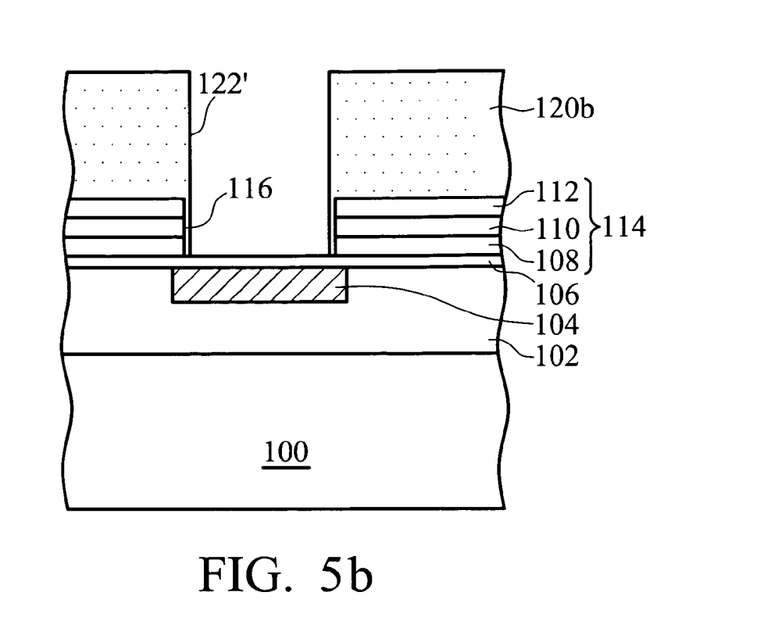

Referring now to FIG. 4, a soft passivation layer 120 is globally coated on the inorganic passivation layer 114 and filled into the first opening 116 by spin-coating. The soft passivation layer 120 is preferably a photosensitive polymer such as polyimide, photoresist or other non-photosensitive stress buffer dielectric materials. Preferably, material density of the soft passivation layer 120 is smaller than the inorganic passivation layer 114. The soft passivation layer 120 is then selectively removed to form a second opening 122 exposing the protective layer 106 and connecting to the first opening 116. The soft passivation layer 120 in some embodiments is initially insoluble in the developer and becomes soluble as a result of UV light irradiation so that the soft passivation layer 120 is removed by exposing UV light through a predetermined photomask and dissolved with the developer. The second opening 122 in the remaining soft passivation layer 120*a* can be larger than the first opening 116 as shown in FIG. 5*a*. Alternately, the second opening 122' in the remaining soft passivation layer 120*b* is smaller than the first opening 116 as shown in FIG. 5*b*, thus the soft passivation layer 120*b* covers the sidewalls of the first opening 116. Also, the first opening 116 can be substantially equal to the second opening 122 in size.

Figure 6:
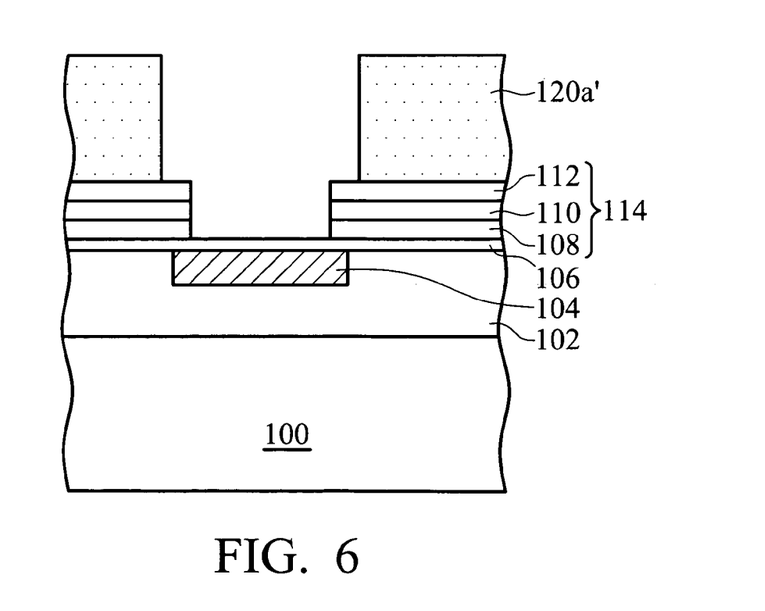

Referring now to FIG. 5*a* and FIG. 6, the remaining soft passivation layer 120*a* is cured by a thermal treatment at 150 to 350° C. for 0.1 to 1 hours thus a soft passivation layer 120*a'* which is slightly reduced in size as compared to the soft passivation layer 120*a* is formed. The soft passivation layer 120*a'* serves as the stress buffer to release or absorb thermal or mechanical stresses resulting from the packaging process. Furthermore, the top copper pad 104 is protected by the protective layer 106 from oxidation or damage while the soft passivation layer 120*a'* is cured.

Figure 7:
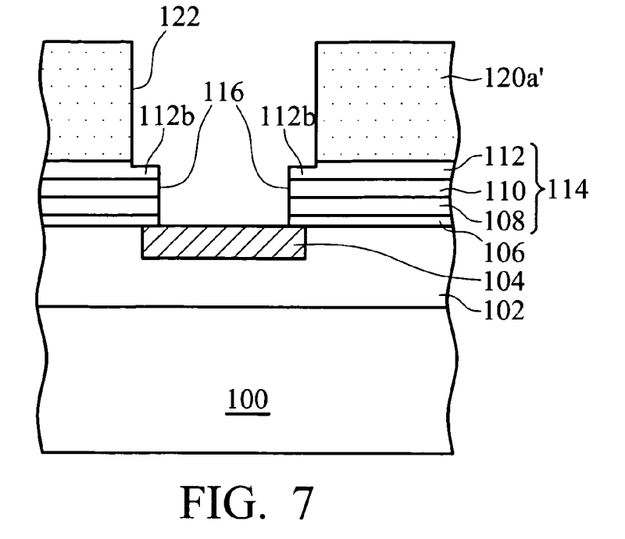

As shown in FIG. 7, the protective layer 106 is removed through the first opening 116 and second opening 122 to expose the top copper pad 104 by dry etching with a reactive gas comprising CF$_4$ and O$_2$ or CHF$_3$ and O$_2$. Alternately, a wet etchant such as phosphoric acid solution can be utilized to remove the protective layer 106. The second silicon oxide layer 112 is partially removed during removal of the protective layer 106 so that the inorganic passivation layer 114 has a thinner portion 112*b* at the top portion of the first opening 116. The thinner portion 112*b* is a detectable feature by for example TEM or SEM analysis.

Figure 8A:
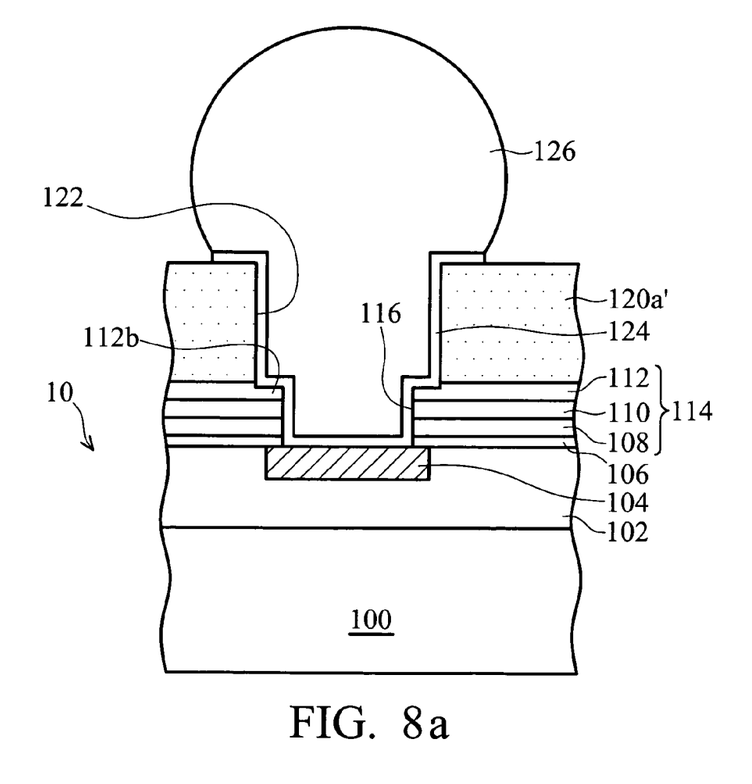

Thereafter, as shown in FIG. 8*a*, an under bump metal layer 124 such as titanium, nickel or an alloy thereof is conformally formed along the first opening 116 and the second opening 122 by physical vapor deposition (PVD) or sputtering. Next, a solder bump 126 made of Ag, Sn, Cu or an alloy thereof is formed on the under bump metal layer 124.

That is, FIG. 8*a* shows a semiconductor device 10 with a solder bump 126 on a semiconductor substrate 100 fabricated by the described exemplary process. The semiconductor device 10 comprises a semiconductor substrate 100 having a top copper pad 104 formed within the dielectric layer 102. The semiconductor device 10 further comprises the protective layer 106 and at least one inorganic passivation layer 114 overlying the protective layer 106 with a first opening 116 exposing the top copper pad 104. The protective layer 106 covers the dielectric layer 102 and a part of the top copper pad 104. The inorganic passivation layer 114 has a thinner portion 112*b* adjacent the top portion of the first opening 116. The semiconductor device 10 further includes a soft passivation layer 120*a'* on the inorganic passivation layer 114 with the second opening 122 larger than the first opening 116. The device 10 further comprises the under bump metal layer 124 conformally formed along the first opening 116 and the second opening 122 and on the top copper pad 104 and the solder bump 126 formed on the under bump metal layer 124. The soft passivation layer 120*a'* of the semiconductor device 10 has relatively more opening shrinkage margin. Also, the semiconductor device 10 has larger opening 122 thus it has higher bump electro-migration resistance. Moreover, the adhesion between the under bump metal layer 124 and the top copper pad 104 will be better.

Figure 8B:
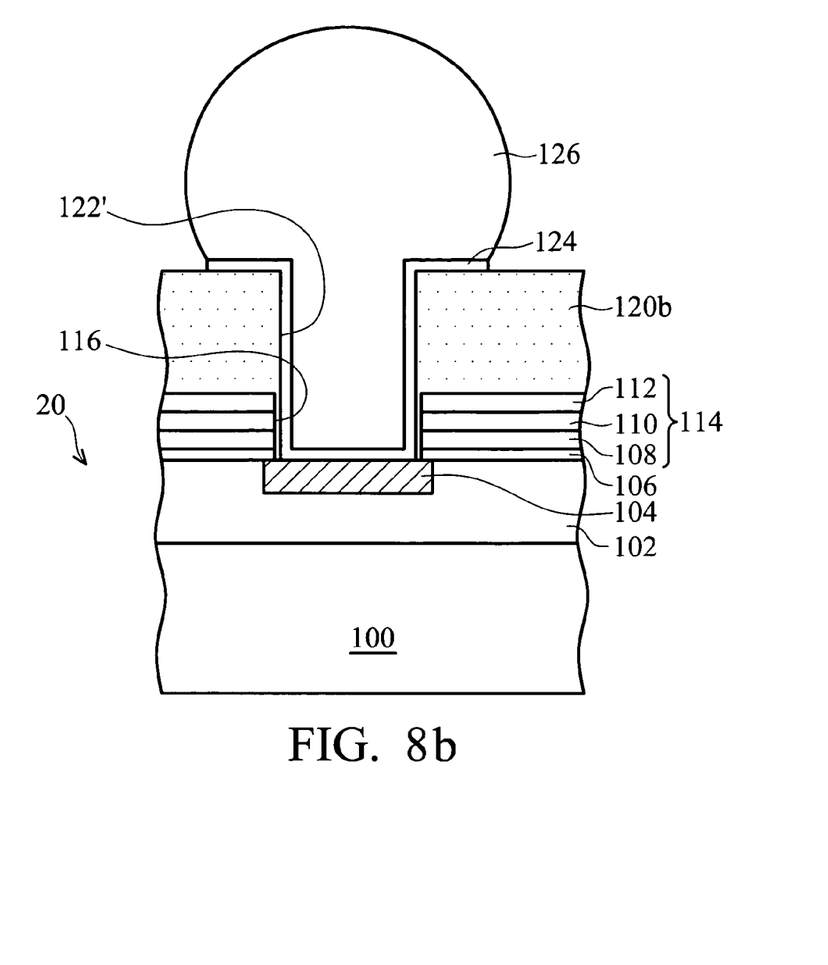

Alternately, FIG. 8*b* shows a semiconductor device 20 with a solder bump 126 on a semiconductor substrate 100 fabricated followed by the device as shown in FIG. 5*b*. The device of FIG. 5*b* is substantially similar to that of FIG. 5*a* except that the second opening 122' in the soft passivation layer 120*b* is smaller than the first opening 116 and the soft passivation layer 120*b* covers the inorganic passivation layer 114 and sidewalls of the first opening 116. The semiconductor device 20 comprises a semiconductor substrate 100 having a top copper pad 104 thereon and a protective layer 106 on a dielectric layer 102. The protective layer 106 covers a part of the top copper pad 104. The semiconductor device 20 comprises at least one inorganic passivation layer 114 overlying the protective layer 106 with a first opening 116 exposing the top copper pad 104. A soft passivation layer 120*b* with a second opening 122' smaller than the first opening 116 covers the inorganic passivation layer 114 and sidewalls of the first opening 116. The under bump metal layer 124 of the semiconductor device 20 is conformally formed along the second opening 122' and on the soft passivation layer 120*b*. The semiconductor device 20 further comprises a solder bump 126 formed on the under bump metal layer 124. The semiconductor device 20 has relatively lower package stress on the dielectric-layer 102, since the soft passivation layer 120b extends to the sidewall of the first opening 116 and contacts the top copper pad 104.

Alternately, there is no protective layer 106 under the inorganic passivation layer 114 in another embodiment of the invention. That is, the lowermost portion, for example first silicon oxide layer 108, of the inorganic passivation layer 114 serves as the protective layer of the top copper pad 104.

Figure 9:
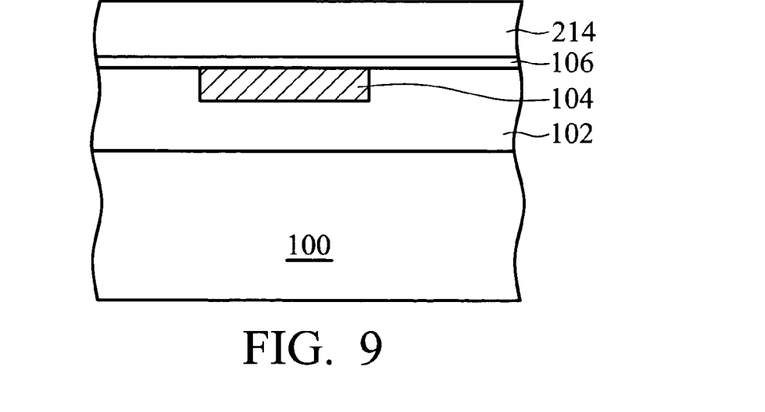
FIG. 9 to FIG. 16 are cross-sections of another embodiment of a method of forming a solder bump on a semiconductor substrate.

FIG. 9 to FIG. 16 are cross-sections of another embodiment of a method of forming a solder bump on a semiconductor substrate. The semiconductor device as shown in FIG. 9 is substantially similar to that of FIG. 1a except that the inorganic passivation layer 214 is a single layer and comprises silicon oxide having a thickness of about 1000 Å to 10,000 Å. Top copper pad 104 is disposed within the dielectric layer 102 and serves as a bond pad on the semiconductor substrate 100. The top copper pad 104 is substantially coplanar with the dielectric layer 102. A protective layer 106 is formed on the dielectric layer 102 and the top copper pad 104. For example, a silicon nitride layer having thickness of about 500 to about 1000 Å, preferably 750 Å is deposited on the semiconductor substrate 100 by low pressure chemical vapor deposition using dichlorosilane ($SiH_2Cl_2$) and ammonia ($NH_3$). Alternately, silicon nitride can be replaced with silicon oxynitride or silicon carbide. The inorganic passivation layer 214 is formed on the protective layer 106 by chemical vapor deposition. Alternately, the inorganic passivation layer 214 may comprise silicon nitride, silicon oxynitride, or silicon carbide while using silicon oxide as the material of the protective layer 106. That is, the etch selectivity between the inorganic passivation layer 214 and the underlying protective layer 106 is preferably 1.2 to 10.

Figure 10:
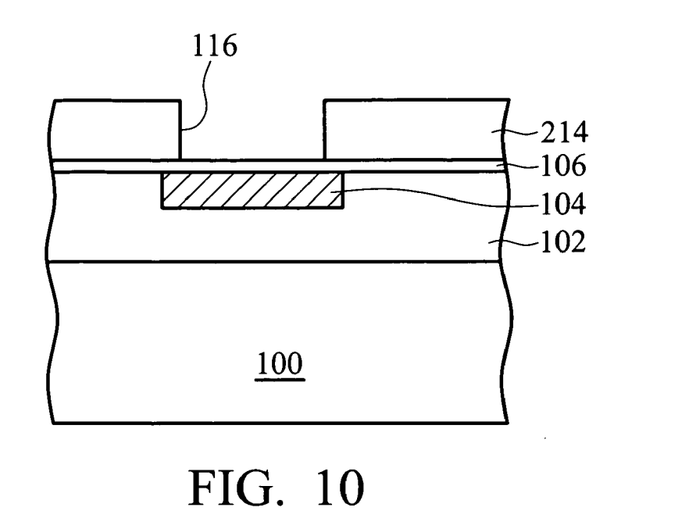

As shown in FIG. 10, the inorganic passivation layer 214 is selectively etched to form a first opening 116 above the top copper pad 104 until the protective layer 106 is exposed by ion reactive etching (RIE) introducing $CF_4$ and $O_2$.

Figure 11:
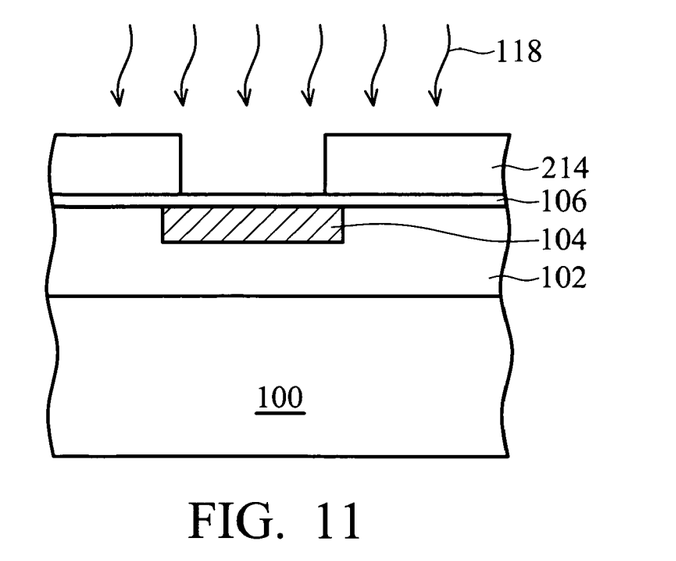

Optionally, as shown in FIG. 11, semiconductor substrate 100 is placed in chamber with $H_2$ 118 introduced therein and annealed at about 300 to 450° C., preferably about 400° C. for about 30 minutes. The charge damage caused by the previous reactive ion etching can be repaired by the thermal treatment.

Figure 12:
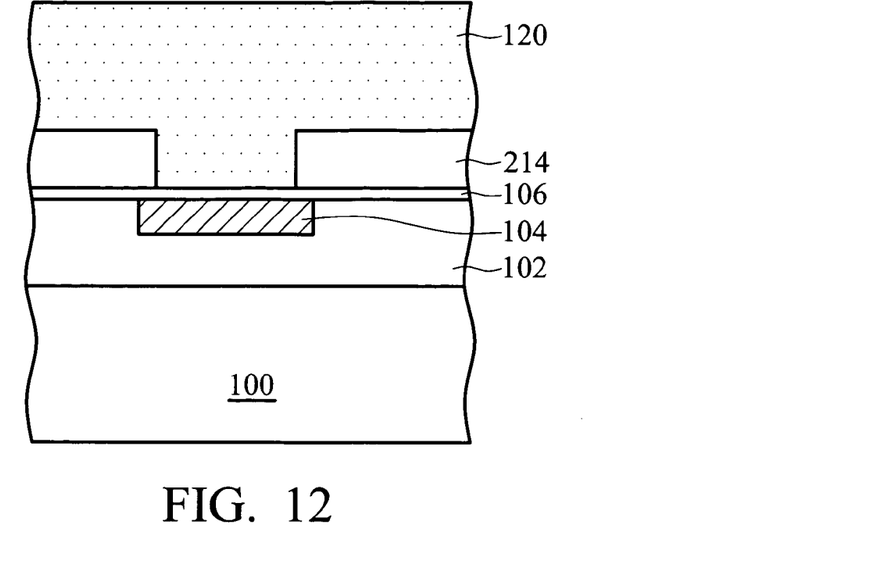
Figure 13:
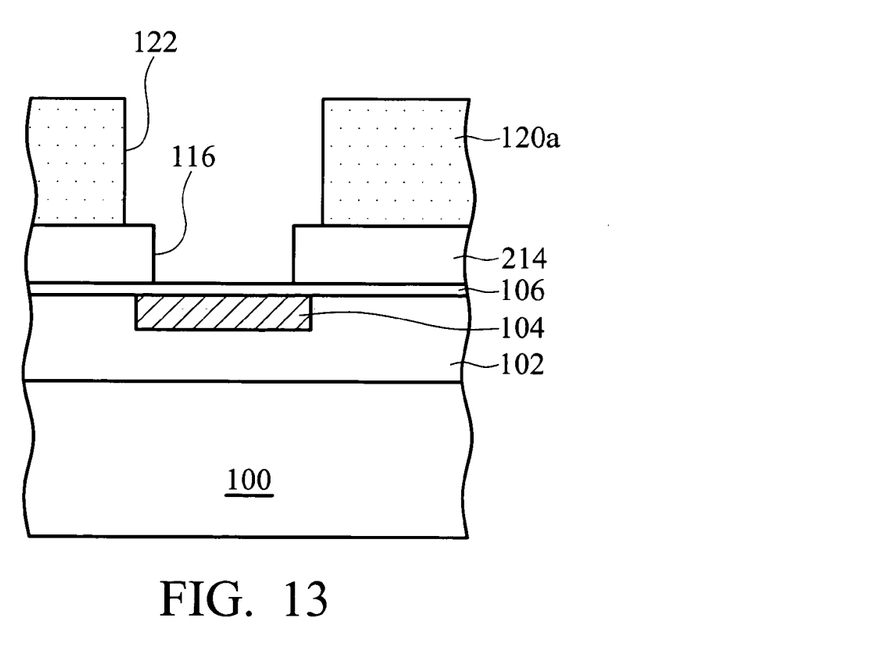

Referring now to FIG. 12 and FIG. 13, a soft passivation layer 120 is globally coated on the inorganic passivation layer 114 and filled into the first opening 116. The soft passivation layer 120 is preferably a photosensitive polymer such as polyimide or other stress buffer materials. Then, the soft passivation layer 120 is selectively removed to form a second opening 122 exposing the protective layer 106 and connecting to the first opening 116. The second opening 122 in the remaining soft passivation layer 120a can be larger than the first opening 116 as shown in FIG. 13.

Figure 14:
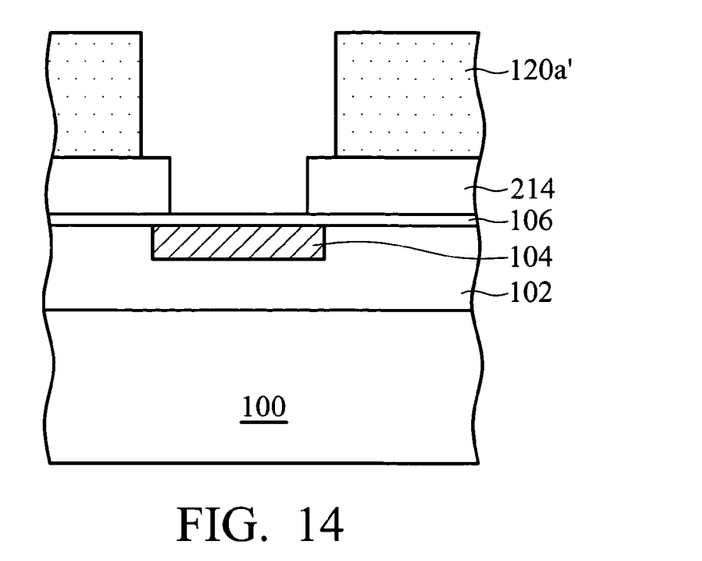

Referring now to FIG. 13 and FIG. 14, the remaining soft passivation layer 120a is cured by thermal treatment at 200 to 300° C. for 0.5 to 1 hours thus a soft passivation layer 120a' which is slightly reduced in size as compared to the soft passivation layer 120a is formed. The soft passivation layer 120a' serves as the stress buffer to release or absorb thermal or mechanical stresses resulting from the packaging process. Furthermore, the top copper pad 104 is protected by the protective layer 106 from oxidation or damage while the soft passivation layer is cured.

Figure 15:
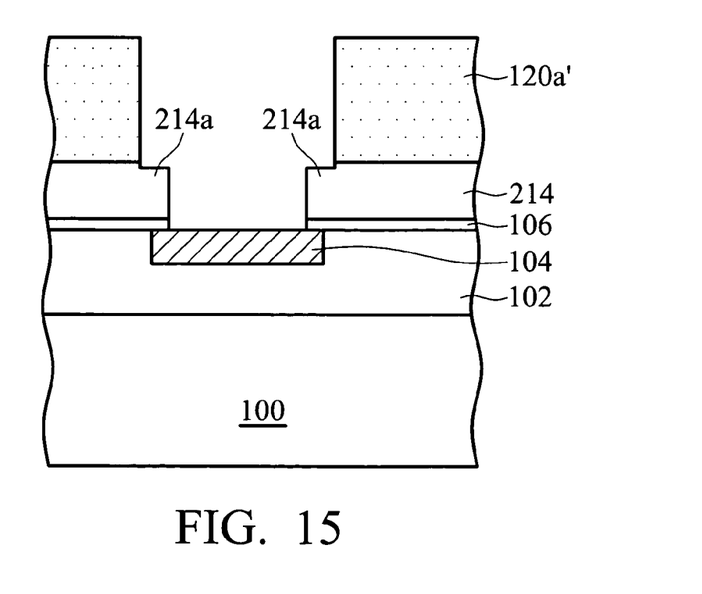

As shown in FIG. 15, the protective layer 106 is removed through the first opening 116 and second opening 122 to expose the top copper pad 104 by dry etching with a reactive gas comprising $CF_4$ and $O_2$ or $CHF_3$ and $O_2$. A wet etchant such as phosphoric acid solution can be used. The inorganic passivation layer 214 is partially removed during removal of the protective layer 106 so that the inorganic passivation layer 214 has a thinner portion 214a at the top portion of the first opening 116. The thinner portion 214a is detectable feature by for example TEM or SEM analysis.

Figure 16:
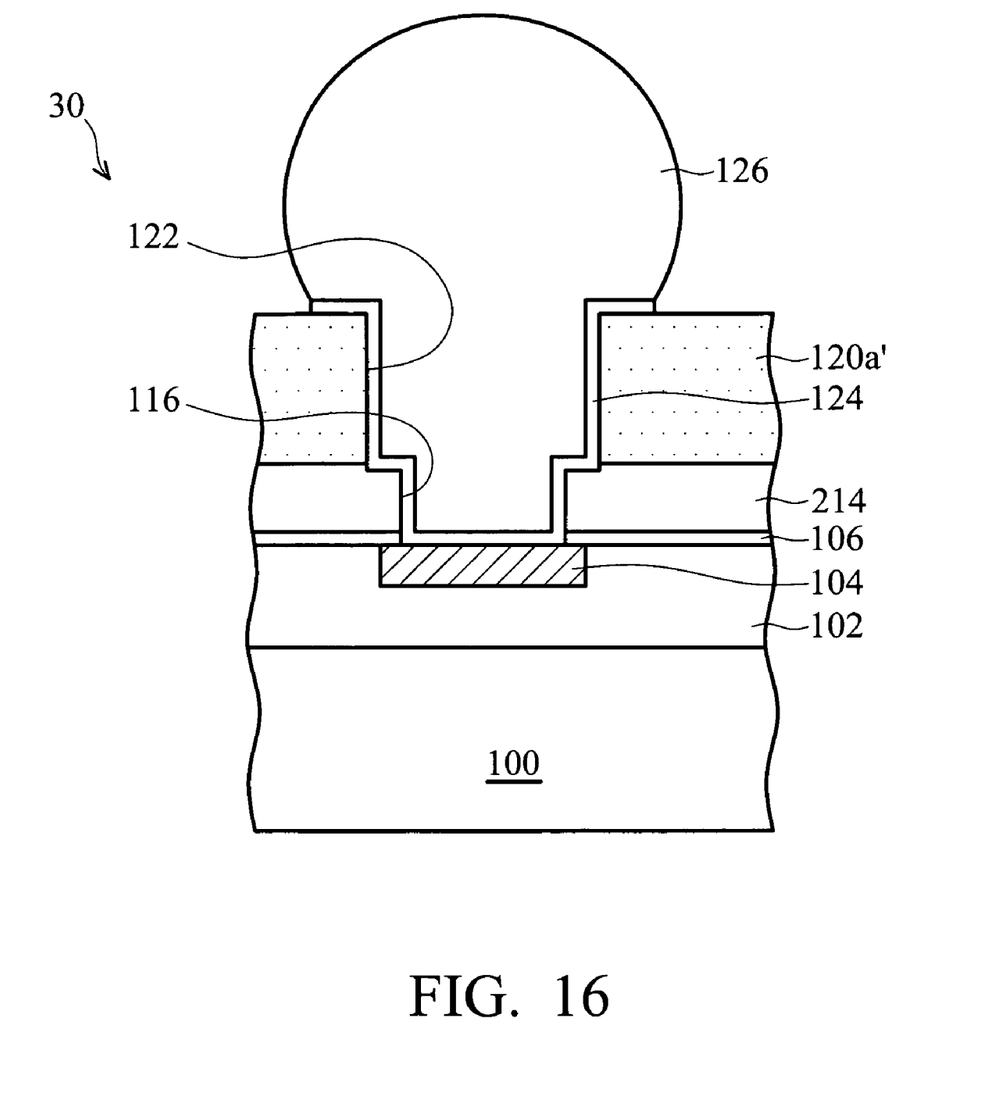

As shown in FIG. 16, an under bump metal layer 124 such as titanium, nickel or an alloy thereof is conformally formed along the first opening 116 and the second opening 122 by physical vapor deposition (PVD) or sputtering. Next, a solder bump 126 made of Ag, Sn, Cu or an alloy thereof is formed on the under bump metal layer 124 thus a semiconductor device 30 is formed.

Figure 17:
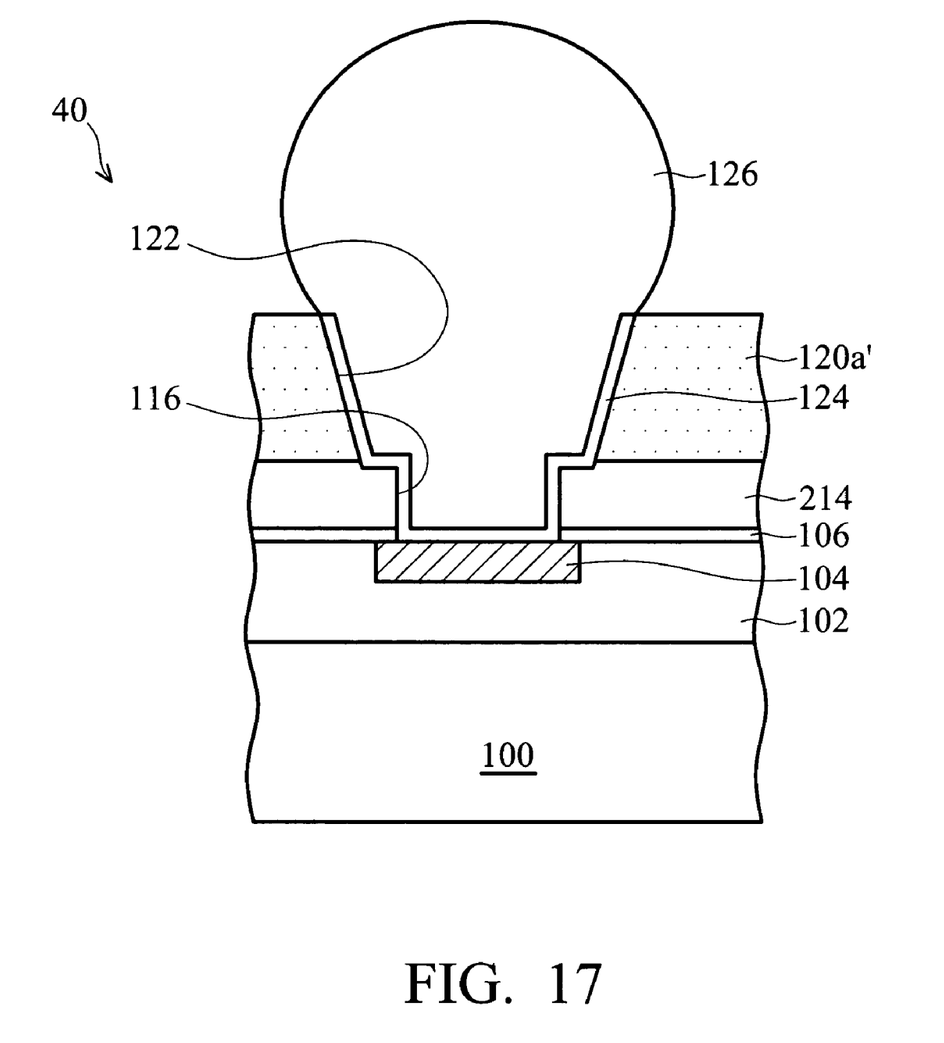
FIG. 17 shows an embodiment of a solder bump structure on a semiconductor substrate.

FIG. 17 shows a semiconductor device 40 with a solder bump 126 on a semiconductor substrate 100. The semiconductor device 40 is substantially similar to semiconductor device 30 except that the second opening 122 through the soft passivation layer 120a' is tapered from the top of the soft passivation layer 120a'.

Figure 18:
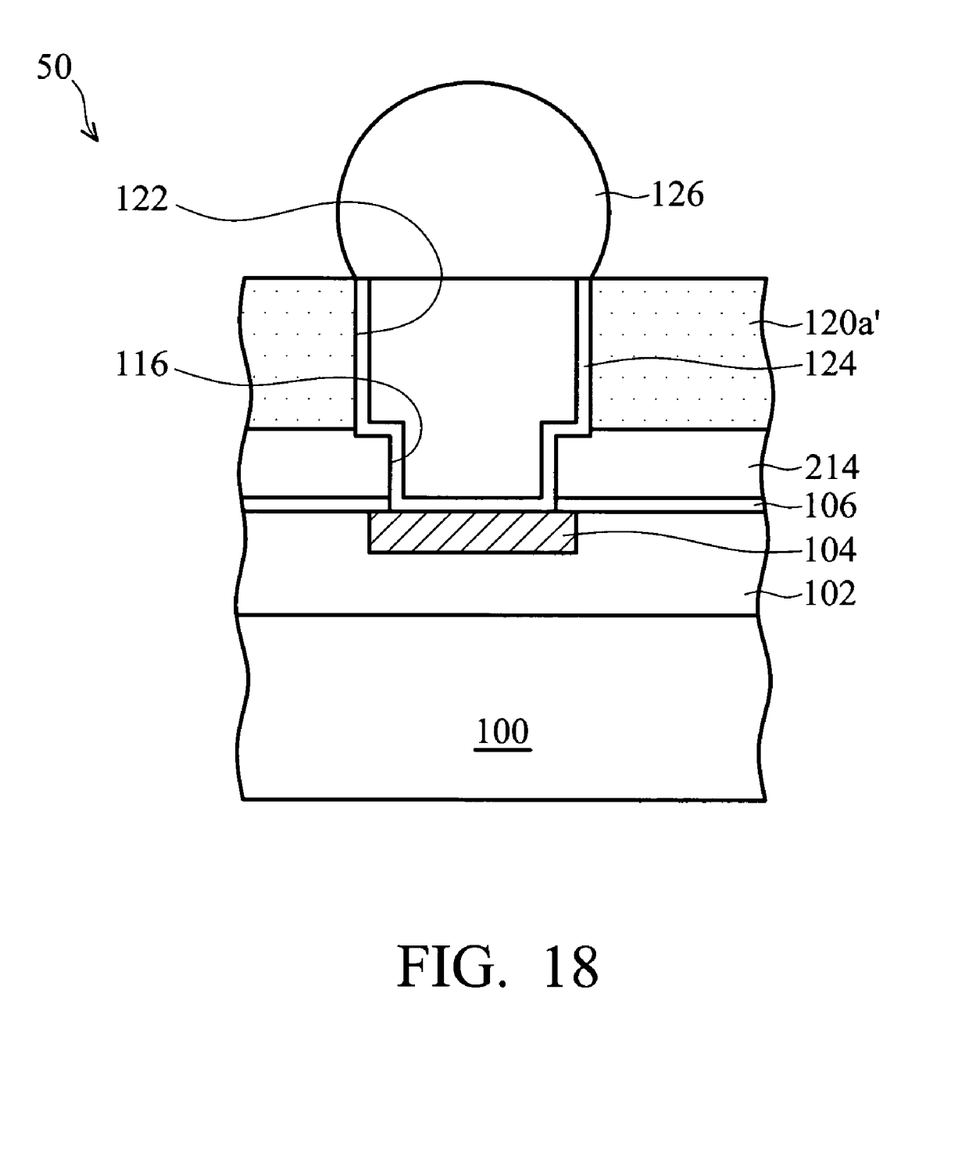
FIG. 18 shows another embodiment of a solder bump structure on a semiconductor substrate.

FIG. 18 shows a semiconductor device 50 with a solder bump 126 on a semiconductor substrate 100. The semiconductor device 50 is substantially similar to semiconductor device 30 except that the under bump metal layer 124 is coplanar with the soft passivation layer 120a' and the solder bump 126 is relatively smaller.

According the invention, formation of an aluminum pad is not necessary. Therefore, the solder bump process can be simplified. Furthermore, the top copper pad 104 is protected by the protective layer 106 from oxidation or damage while the soft passivation layer is cured. Moreover, the stresses such as thermal or mechanical stresses created by the package of the integrated circuit chip can be reduced.

While the invention has been described with reference to various illustrative embodiments, the description is not intended to be construed in a limiting sense. Various modifications of the illustrative embodiments, as well as other embodiments of the invention, will be apparent to those people skilled in the art upon reference to this description. It is therefore contemplated that the appended claims will cover any such modifications or embodiments as may fall within the scope of the invention defined by the following claims and their equivalents.

What is claimed is:

1. A solder bump on a semiconductor substrate, comprising:
    a semiconductor substrate having a top copper pad thereon;
    a protective layer on the top copper pad and the semiconductor substrate, wherein the protective layer partially covers the top copper pad;
    at least one inorganic passivation layer overlying the protective layer with a first opening exposing the top copper pad, wherein the inorganic passivation layer has a thinner portion adjacent a top portion of the first opening;
    a soft passivation layer on the inorganic passivation layer with a second opening larger than the first opening;
    an under bump metal layer conformally formed along the first opening and the second opening; and
    a solder bump formed on the under bump metal layer, wherein the thinner portion directly contacts the under bump metal layer, and the thinner portion has a recessed upper surface.

2. The solder bump as claimed in claim 1, wherein the top copper pad embedded in a low-k dielectric material with a dielectric constant less than 3.2 and connects to copper wiring interconnects.

3. The solder bump as claimed in claim 1, wherein the protective layer comprises silicon nitride, silicon oxynitride, or silicon carbide.

4. The solder bump as claimed in claim 3, wherein the inorganic passivation layer is a single layer and comprises silicon oxide.

5. The solder bump as claimed in claim 3, wherein the inorganic passivation layer is triple-layered and comprises a first silicon oxide layer, a second silicon oxide layer and a silicon nitride layer sandwiched between the first and the second silicon oxide layers.

6. The solder bump as claimed in claim 1, wherein the soft passivation layer comprises a photosensitive polymer.

7. The solder bump as claimed in claim 6, wherein, the photosensitive polymer comprises polyimide.

8. The solder bump as claimed in claim 1, wherein the protective layer comprises silicon oxide.

9. The solder bump as claimed in claim 8, wherein the inorganic passivation layer is a single layer and comprises silicon nitride, silicon oxynitride, or silicon carbide.

10. The solder bump as claimed in claim 9, wherein the inorganic passivation is triple-layered and comprises a first silicon nitride layer, a second silicon nitride layer and a silicon oxide layer sandwiched between the first and the second silicon nitride layers.

* * * * *